United States Patent [19]

Pease

[11] Patent Number: 5,170,320
[45] Date of Patent: Dec. 8, 1992

[54] AVIONIC TRAY AND DETACHABLE METERING PLATE

[75] Inventor: Raymond J. Pease, Sherborne, England

[73] Assignee: Hollingsead International, Inc., Santa Fe Springs, Calif.

[21] Appl. No.: 752,039

[22] Filed: Aug. 29, 1991

[51] Int. Cl.$^5$ .............................................. H05K 7/20
[52] U.S. Cl. .................................... 361/383; 277/178
[58] Field of Search ............... 277/178, 226; 361/383, 361/384; 174/152 G, 153 G, 65 G

[56] References Cited

U.S. PATENT DOCUMENTS

| | | | |
|---|---|---|---|
| 1,873,592 | 8/1932 | James | 277/178 |
| 3,005,648 | 10/1961 | Christensen | 277/178 |
| 3,243,240 | 3/1966 | Arthur | 277/178 |
| 3,482,846 | 12/1969 | Kudlaty | 277/178 |
| 3,740,061 | 6/1973 | Jensen | 277/178 |
| 3,771,023 | 11/1973 | Hollingsead et al. | |
| 3,804,217 | 4/1974 | Keijzer et al. | 277/178 |
| 4,458,296 | 7/1984 | Bryant et al. | |

Primary Examiner—Gregory D. Thompson
Attorney, Agent, or Firm—Harold L. Jackson

[57] ABSTRACT

An avionic tray assembly for supporting electronic instruments on a shelf and controlling the volume of cooling air between the instrument and a plenum chamber is described. The tray bottom includes a pocket formed by a straight side wall extending downwardly at an angle within the range of 30° to 60° and terminating in a rim surrounding the opening to the plenum chamber. A flexible gasket secures an apertured metering plate within the pocket. The gasket includes an upper portion which is arranged to compressed between the bottom of an installed instrument, the sloping wall of the pocket and the upper surface of the metering plate adjacent the periphery thereof to seal the instrument to the plenum chamber so that the apertures in the metering plate control the volume of cooling air flowing between the instrument and the plenum chamber.

15 Claims, 1 Drawing Sheet

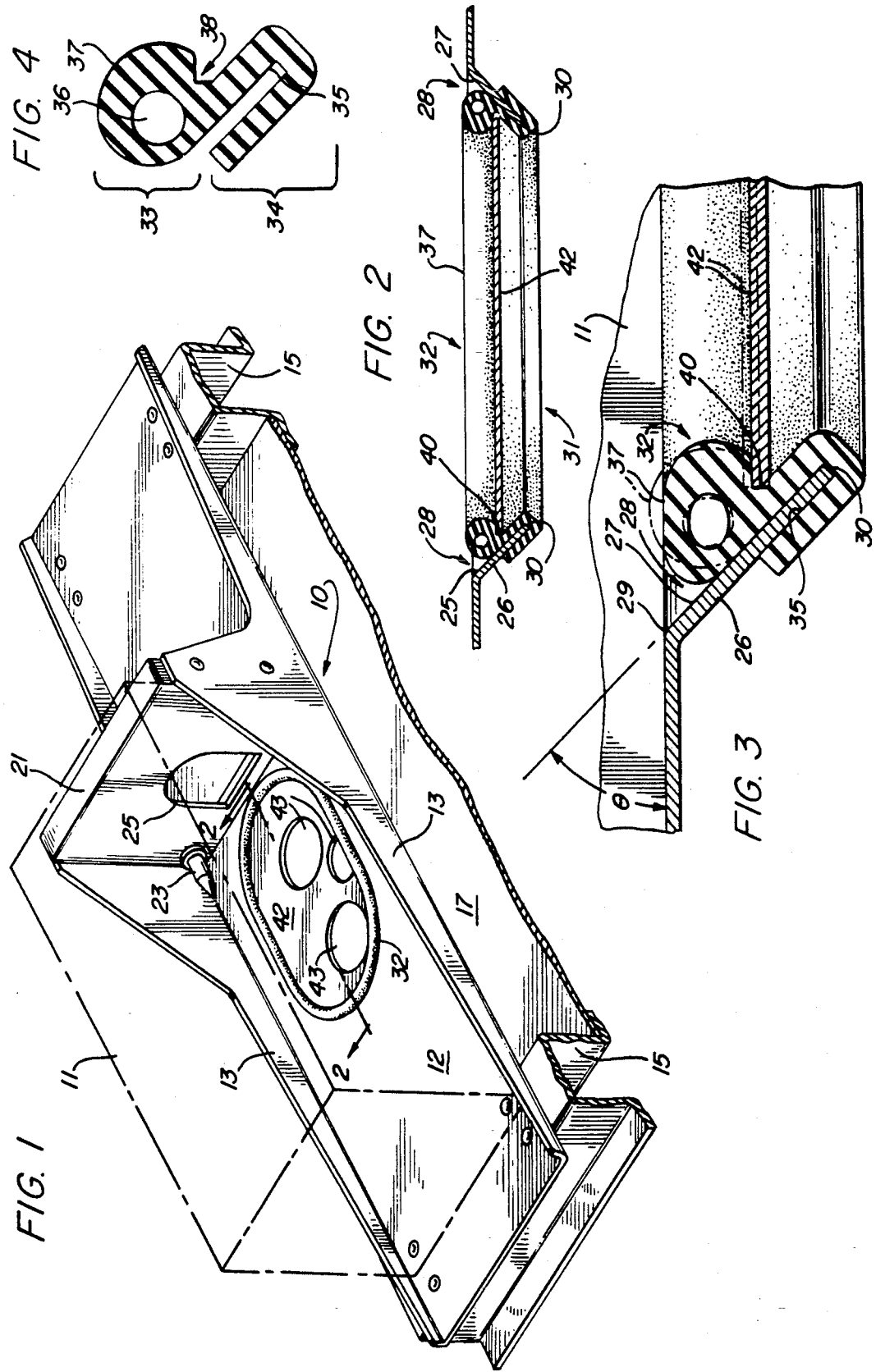

AVIONIC TRAY AND DETACHABLE METERING PLATE

BACKGROUND OF THE INVENTION

1. Field of the Invention

The present invention relates to avionic racking and more particularly to tray assemblies utilized in supporting electronic instruments on shelves and controlling the flow of cooling air to or from the instruments.

2. Description of the Prior Art

In an aircraft, each piece of electronic equipment is generally referred to as a line replaceable unit, or LRU, and is supported on an individual tray. The tray, in turn, is supported at its front and back ends on a pair of cross beams. The trays are generally made of aluminum in standard ATR widths to accommodate the various sizes of available LRUs. In a typical shelf, a plurality of trays are closely spaced on the cross beams to completely enclose the entire length of the shelf. A closure plate is positioned beneath the cross beams to completely enclose the area directly below the trays and form an air plenum chamber. The air plenum chamber of each shelf then communicates with a vertical manifold, located at the ends of the shelves, which in turn is connected to a source of positive pressure (e.g. 6-10 lbs./in$^2$) or negative pressure (e.g. vacuum pump).

The outer casing or housing of each instrument is typically provided with standard air vents at the top, bottom and/or sides to permit a cooling fluid such as air to be circulated therethrough. Each tray includes a pocket formed below the bottom surface thereof, with the pocket having an apertured metering plate secured therein by a gasket to enable the supported instrument to communicate with the plenum chamber.

The gasket extends out of the pocket above the bottom surface of the tray to sealingly engage the bottom of the LRU. This arrangement channels all of the air drawn into or forced out of the plenum chamber through the LRUs mounted on the trays.

One such arrangement is described in U.S. Pat. No. 3,771,023, assigned to the assignee of this application. The tray assembly of the '023 patent has proven to be particularly effective because the metering plate is detachable and replaceable in the field. The use of replaceable metering plates with different numbers and sizes of openings therein eliminates the need to replace the entire tray when an LRU is replaced with one having different cooling requirements.

To accommodate the use of detachable metering plates, the pocket in the '023 tray is formed with a vertically extending side wall and terminates in a horizontally extending rim. While the '023 tray assembly has been very successful, it is difficult and expensive to manufacture. Complicated expensive tooling and high powered presses are required to deep draw the metal (typically aluminum) and form the pocket. Maintaining the precise dimensions necessary for sealing is also difficult with such a deep drawing operation. In addition the deep drawing process can only be carried out on aluminum in its softest state (i.e. an annealed or zero state). A subsequent heat treatment operation is therefore necessary to bring the metal to an acceptable hardness and strength i.e. T4. The gasket described in the '023 patent is also somewhat complex and is anchored in place primarily by the horizontal rim on the pocket and the metering plate.

U.S. Pat. No. 4,458,296 describes an avionic tray in which the pocket is formed with slanted sides and a horizontal shelf having an opening therein for communication with the plenum chamber. A gasket is mounted on the horizontal shelf. The gasket includes a flexible V-shaped projection or lip which extends upwardly from the main body of the gasket (beyond the bottom surface of the tray) to contact the bottom of the LRU. A metering plate is bonded to the gasket. Selected holes in the metering plate may be closed with removable plugs to control the air flow.

The gasket of the '296 patent relies upon the flexing of the V-shaped projection or lip when contacted by the bottom of the LRU to provide sealing. Furthermore, the gasket is not compressed against the sides (or even the shelf) of the pocket to anchor the gasket in place during the insertion of the LRU. Such an arrangement creates a risk that the projection will not provide an air tight seal with the bottom of the LRU or that the gasket will become dislodged from the shelf rim upon installation of the LRU or both. Also the metering plate has a smaller periphery than the opening in the pocket which could allow the plate to drop through the opening into the plenum chamber in the event that the bond failed during the installation or removal of an LRU. While the tray described in the '296 patent is less complicated and less expensive to manufacture than the '023 tray, it is still relatively expensive to manufacture because of the horizontal shelf formed in the pocket.

There is thus a need for an avionic tray assembly suitable for use with detachable and replaceable metering plates which is simpler and less expensive to manufacture than the prior assemblies described above and more reliable in its sealing function than the tray/gasket arrangement described in the '296 patent.

SUMMARY OF THE INVENTION

An avionic tray assembly for supporting an instrument housing above a plenum chamber in accordance with the present invention includes a tray having a substantially flat bottom surface for supporting an LRU. A pocket with an opening for communicating with the plenum chamber is formed in the tray bottom by a downwardly and inwardly extending generally annularly shaped flange which terminates in a rim. The flange intersects the bottom surface at an acute angle within the range of about 30° to 60°. The assembly includes a metering plate having apertures therein for controlling the volume of cooling fluid or air flowing between the LRU and the plenum chamber. The metering plate has a peripheral edge which is larger than the peripheral edge of the pocket rim and smaller than the flange periphery adjacent the bottom surface of the tray.

A flexible gasket secures the metering plate within the pocket The gasket includes an upper and lower portion with the lower portion having an outer groove arranged to slide over the rim of the pocket. The upper portion extends upwardly from the inner surface of the flange to a position above the bottom surface of the tray. When an LRU is installed on the tray the upper portion of the gasket is compressed between the bottom surface of the instrument housing, the slanted inner surface of the flange and the upper surface of the metering plate adjacent the peripheral edge thereof to seal the housing to the plenum chamber and anchoring the gasket and metering plate in the pocket.

A primary advantage of the present invention is a simplification of the manufacturing process of the pocket forming the air flow opening. Forming the pocket with a substantially straight flange eliminates a deep drawing operation with its attendant complicated and expensive tooling. In addition, the tray and pocket can be formed from hardened aluminum sheet metal.

Another primary advantage of the present invention is the design of the gasket which in cooperation with the flanged pocket allows the upper portion of the gasket to be compressed between the bottom surface of the LRU, the inner surface of the flange and the metering plate. The compressed gasket not only insures a substantially air tight seal between LRU and the plenum chamber, but prevents any movement of the metering plate. This arrangement will also accommodate a wider range of manufacturing tolerances than the prior art tray assemblies.

The features and advantages of the present invention can best be understood by reference to the following description taken in conjunction with the accompanying drawings in which like elements are given the same reference numeral.

DESCRIPTION OF THE DRAWINGS

FIG. 1 is a perspective view of the improved avionic tray assembly in accordance with the present invention;

FIG. 2 is an enlarged cross-sectional view of the gasket, metering plate and tray taken along lines 2—2 of FIG. 1 illustrating how the gasket interconnects the metering plate to the tray;

FIG. 3 is an enlarged cross-sectional view partially broken away of the gasket, metering plate and tray with an instrument housing inserted on the tray to illustrate how the gasket is compressed to ensure a seal and maintain the metering plate in place; and FIG. 4 is an enlarged cross-sectional view of the gasket.

DESCRIPTION OF THE PREFERRED EMBODIMENT

Referring now to the drawings, FIG. 1 shows an avionic tray generally indicated by arrow 10, for supporting an electronic instrument encased within a housing 11 (shown in broken lines). The tray 10 comprises a bottom section 12 and a pair of side rails 13 extending upwardly along the lateral edges thereof. The bottom section 12 is adapted to be mounted at its ends to a pair of cross-channels 15 with the entire length of the channels 15 being covered with similar trays to form a shelf. A closure plate 17 is connected to the bottom of the cross-channels to completely enclose the space below the trays 10 to form a plenum chamber. The plenum chamber is connected to a manifold (not shown) at one end of the shelf in the conventional manner. The plenum chamber may be connected to a low pressure source (vacuum) or a high pressure source (e.g. 5-10 psi) of cooling fluid such as air for extracting cooling fluid from or forcing cooling fluid into the instrument housing.

The side rails 13 function as a guide for the supported instrument and as a support for a backplate 21. The backplate 21 includes a pair of guide pins 23 for receiving the mating portion of the instrument and a cut-out portion 25 for receiving an electrical connector (not shown) which is adapted to engage the plug portion of a connector carried by the instrument housing.

An annular or oval flange or pocket wall 26 forms a pocket 28 in the bottom section 12 of the tray with a central opening 31 in communication with the plenum chamber. The flange or pocket wall 26 has straight sides and extends downwardly and inwardly from the junction 29 with the tray's bottom surface 11 at an acute angle $\theta$ within the range of about 30° to 60° and preferably at about 45° as is shown more particularly in FIGS. 2 and 3. The flange or wall 26 terminates in an annular or oval rim 30 for channeling air flow between the instrument housing 11 and the plenum chamber. When the angle $\theta$ is about 45° the rim or edge 30 preferably extends below the tray's bottom surface 12 about $\frac{3}{8}$" of an inch.

An annular or oval gasket 32 manufactured of a suitable elastomeric or other flexible material extends around the periphery of the flange rim 30 and seats against an inner surface 27 of the flange 26 to seal the instrument housing to the plenum chamber as will be explained. The gasket may be formed from an extruded length of silicon rubber or other suitable material which is cut and bonded at its ends to form an oval.

As is shown in FIGS. 2–4 the gasket 32 in a left hand cross-sectional view (FIG. 3 or 4) takes the general shape of the arabic numeral 9 tilted counterclockwise at the flange angle. The gasket 32 includes an upper portion 33 and a lower portion 34 (FIG. 4). The lower portion 34 is generally U-shaped in cross-section and includes an outer annular groove 35 therein adapted to slide over (or receive) the peripheral rim or edge 30 of the flange 26 for securing the gasket to the flange and within the tray pocket 29. The groove 35 is preferably about one-fourth of an inch in length.

The upper gasket portion 33 is generally cylindrically shaped with a hollow annular chamber 36 formed therein. The top surface 37 of the upper portion 33 of the gasket extends above the bottom tray surface (in the absence of an instrument housing) so that the upper portion 33 is compressed when an instrument housing is positioned on the tray to ensure an air tight seal as will be more fully explained.

A second groove 38 (generally V-shaped) is formed at the inner junction of the upper and lower gasket portions or sections for receiving the peripheral edge 40 of a metering plate 42. The metering plate 42 includes one or more metering ports 43 for controlling the amount of air to be supplied to or drawn from the instrument housing 11. The metering plate 42 can be readily removed from the gasket and one with a different metering port arrangement inserted by forcing one side of the upper portion 33 of the gasket outwardly and upwardly while applying the appropriate force (upward during removal or downward during insertion) on the adjacent side of the metering plate.

Upon installing the instrument housing 11, the front bottom portion of the housing is placed in the tray 10 between side rails 13 and slid rearwardly until the rear of the housing contacts the back plate 21 to make the necessary electrical connection with the socket or sockets mounted on the back plate. The bottom of the instrument housing contacts the exposed portion of the gasket 32 and applies a downward force to the top surface 37 of the upper portion 33 of the gasket 32. This force compresses the upper portion 33 of the gasket between the bottom surface of the instrument housing, the inner surface 27 of the flange 26 and the upper surface of the metering plate 42 adjacent the rim 40 thereof as is illustrated in FIG. 3. This compressive force locks the gasket and the metering plate in place and ensures an air tight seal (within the specifications set by ARINC and international military agencies).

The seating of the gasket against the inclined inner surface 27 of the flange or pocket wall 26 provides an important advantage of this invention by accommodating a wider range of manufacturing tolerances while ensuring the necessary airtight seal.

A further advantage of the present invention is the reduced cost of manufacturing the tray. The flange can be formed from the tray's bottom surface by a simple pressing operation which does not require complicated or expensive tooling. Further, the pressing operation can be performed on sheet metal such as aluminum in its hardened state (e.g. T4) thereby eliminating subsequent heat treating operations.

Various modifications to the described embodiment will be apparent to those skilled in the art without involving any departure from the spirit and scope of my invention as defined in the appended claims.

What is claimed is:

1. In an avionic tray assembly for supporting an electronic instrument housing adjacent an air plenum chamber including a tray having a substantially flat bottom surface with an opening therein adapted to communicate with the plenum chamber, a seal positioned within the opening and a metering plate with one or more metered apertures therein secured by the gasket over the opening for controlling the volume of air flow between the housing and the plenum chamber, the improvement comprising:

the opening in the tray being formed by a downwardly extending flange terminating in a rim, the flange extending at an angle to the flat bottom surface of the tray within the range of about 30° to 60°;

the gasket having a lower portion defining a groove for receiving the flange rim to secure the gasket to the flange and an upper portion extending upwardly from the flange and defining an upper surface positioned above the bottom surface of the tray for engaging the bottom surface of an instrument housing when positioned on the tray; and the metering plate having a larger outer periphery than the inner periphery of the tray rim and being positioned between the upper and lower portions of the gasket, the upper portion of the gasket being arranged to be compressed between the bottom surface of an instrument housing when positioned on the tray assembly, the flange and the upper surface of the metering plate adjacent the periphery thereof to channel the air flow between an instrument housing when positioned on the tray assembly and the plenum chamber through the metering plate.

2. The avionic tray assembly of claim 1 wherein the section of the flange against which the upper portion of the gasket is compressed defines a flat surface.

3. The avionic tray assembly of claim 2 wherein the flange extends at about an angle of 45° to the bottom surface of the tray.

4. The avionic tray assembly of claim 3 wherein the upper portion of the gasket defines a hollow annular chamber.

5. The avionic tray assembly of claim 4 wherein the gasket forms a generally V-shaped groove at the inner junction of the upper and lower portions thereof for receiving the peripheral edge of the metering plate.

6. The avionic tray assembly of claim 5 wherein the metering plate is releasably retained within the gasket.

7. In an avionic tray assembly for supporting an electronic instrument housing above a plenum chamber and controlling the volume of cooling fluid flowing between the housing and the chamber, the combination comprising:

a tray having a substantially flat bottom surface for supporting an instrument housing and defining an opening therein formed by a flange extending below the flat bottom surface and terminating in a rim, the periphery of the rim being smaller than the periphery of the flange adjacent the bottom tray surface, the flange being substantially straight and having an inner surface, the flange forming an acute angle $\theta$ with the bottom tray surface within the range of about 30° to 60°;

a metering plate having at least one aperture therein for controlling the volume of cooling fluid flowing to or from an instrument housing when supported on the tray, the metering plate having an upper surface and a peripheral edge which is smaller than the opening adjacent the bottom surface of the tray and larger than the periphery of the flange rim; and a flexible gasket having a lower portion with an outer groove therein for receiving the flange rim to secure the gasket to the flange and an upper portion extending upwardly from the inner surface of the flange to a position above the bottom surface of the tray, the gasket being arranged to releasably secure the metering plate above the flange rim and below the bottom surface of the tray, the upper portion of the gasket being arranged to be compressed between bottom surface of an instrument housing when supported on the tray, the inner surface of the flange and the upper surface of the metering plate adjacent the periphery thereof to provide a seal between an instrument housing when supported on the tray assembly and the plenum chamber.

8. The avionic tray assembly of claim 7 wherein the gasket in a left hand cross-sectional view is generally in the shape of an arabic numeral 9 tilted counter clockwise at the flange angle, the lower portion of the gasket being generally U-shaped and the upper portion being generally cylindrically shaped.

9. The avionic tray assembly of claim 8 wherein the upper portion of the gasket defines a hollow annular chamber.

10. The avionic tray of claim 7 wherein the angle $\theta$ is about 45°.

11. The avionic tray of claim 7 wherein the flange extends below the bottom surface of the tray about ⅜".

12. The avionic tray assembly of claim 10 wherein the gasket defines an inner generally V-shaped groove at the junction between the upper and lower portions thereof for releasably securing the metering plate to the tray.

13. An avionic tray assembly for supporting an electronic instrument housing above a plenum chamber and directing cooling air between the housing and the chamber comprising:

a tray having a substantially flat bottom surface for supporting an instrument housing and defining an annular opening therein formed by a pocket terminating in a rim and having a continuous side wall extending below the flat bottom surface and toward the opening, the side wall of the pocket being substantially straight and having an inner surface, the side wall and the bottom tray surface intersecting at an acute angle θ within the range of about 30° to 60°.

an annular flexible gasket having a lower portion with an outer annular groove therein extending over the rim and a portion of the side wall of the pocket for securing the gasket to the pocket, the gasket further having an upper portion extending upwardly from the inner surface of the flange to a position above the bottom surface of the tray, the gasket including a inner annular groove at the junction of the upper and lower portions; and a metering plate having a plurality of metering ports therein for controlling the volume of air flowing between the housing and the plenum chamber, the metering plate having an upper surface and a peripheral edge which is smaller than the opening adjacent the bottom surface of the tray and larger than the periphery of the pocket rim, the peripheral edge of the metering plate being disposed within the second groove of the gasket, the upper portion of the gasket being arranged to be compressed between bottom surface of an instrument housing when positioned on the tray, the inner surface of the side wall of the pocket and the upper surface of the metering plate adjacent the periphery thereof to provide a seal between an instrument housing when positioned on the tray and the plenum chamber and direct the flow of air through the ports in the metering plate.

14. The avionic tray assembly of claim 12 wherein the angle θ is about 45°.

15. The avionic tray assembly of claim 14 wherein the upper portion of the gasket defines a hollow annular chamber.

* * * * *